US009058290B2

(12) United States Patent
Chan et al.

(10) Patent No.: US 9,058,290 B2
(45) Date of Patent: *Jun. 16, 2015

(54) MEMORY PROTECTION CACHE

(71) Applicant: SK hynix memory solutions inc., San Jose, CA (US)

(72) Inventors: Ka Hou Chan, Macau (MO); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,440

(22) Filed: Apr. 28, 2014

(65) Prior Publication Data
US 2014/0325313 A1     Oct. 30, 2014

Related U.S. Application Data

(63) Continuation of application No. 13/273,047, filed on Oct. 13, 2011, now Pat. No. 8,719,664.

(60) Provisional application No. 61/474,686, filed on Apr. 12, 2011.

(51) Int. Cl.
*G11C 29/00*     (2006.01)
*G06F 11/10*     (2006.01)
*G11C 29/04*     (2006.01)

(52) U.S. Cl.
CPC .... *G06F 11/1076* (2013.01); *G11C 2029/0411* (2013.01); *G06F 11/1048* (2013.01)

(58) Field of Classification Search
CPC ............ G06F 11/1048; G06F 11/1076; G11C 2029/0411
USPC .......................................... 714/766; 711/103
See application file for complete search history.

(56) References Cited

U.S. PATENT DOCUMENTS

| | | | |
|---|---|---|---|
| 2011/0161554 A1* | 6/2011 | Selinger et al. | 711/103 |
| 2011/0213945 A1* | 9/2011 | Post et al. | 711/173 |
| 2012/0117305 A1* | 5/2012 | Arya | 711/103 |
| 2013/0080730 A1* | 3/2013 | Kim | 711/203 |

\* cited by examiner

*Primary Examiner* — Sam Rizk
(74) *Attorney, Agent, or Firm* — Van Pelt, Yi & James LLP

(57) ABSTRACT

Accessing data at a memory is described. A request associated with a read or write operation is received, wherein the request includes a logical address associated with the memory. A physical address is generated based at least in part on the logical address. A block of data at the memory that includes data associated with the physical address is determined. Data at the determined block of data and a corresponding set of ECC from the memory are accessed. Whether the accessed data can be decoded based at least in part on the corresponding set of ECC is determined.

17 Claims, 14 Drawing Sheets

MEMORY PROTECTION CACHE

CROSS REFERENCE TO OTHER APPLICATIONS

This application is a continuation of co-pending U.S. patent application Ser. No. 13/273,047, entitled MEMORY PROTECTION CACHE filed Oct. 13, 2011 which is incorporated herein by reference for all purposes, which claims priority to U.S. Provisional Patent Application No. 61/474, 686 entitled MEMORY PROTECTION CACHE filed Apr. 12, 2011 which is incorporated herein by reference for all purposes.

BACKGROUND OF THE INVENTION

Microprocessors sometimes need to access an external memory for data, which may be slow compared to accessing a local memory. As a result, some systems have a local cache memory for storing recently used data. However, current cache memory schemes have a variety of drawbacks, particularly with respect to error detection and correction. Therefore, it would be desirable to create a more efficient error detection and correction scheme with respect to memory and one that does not require significant changes to memory interface bus architecture.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
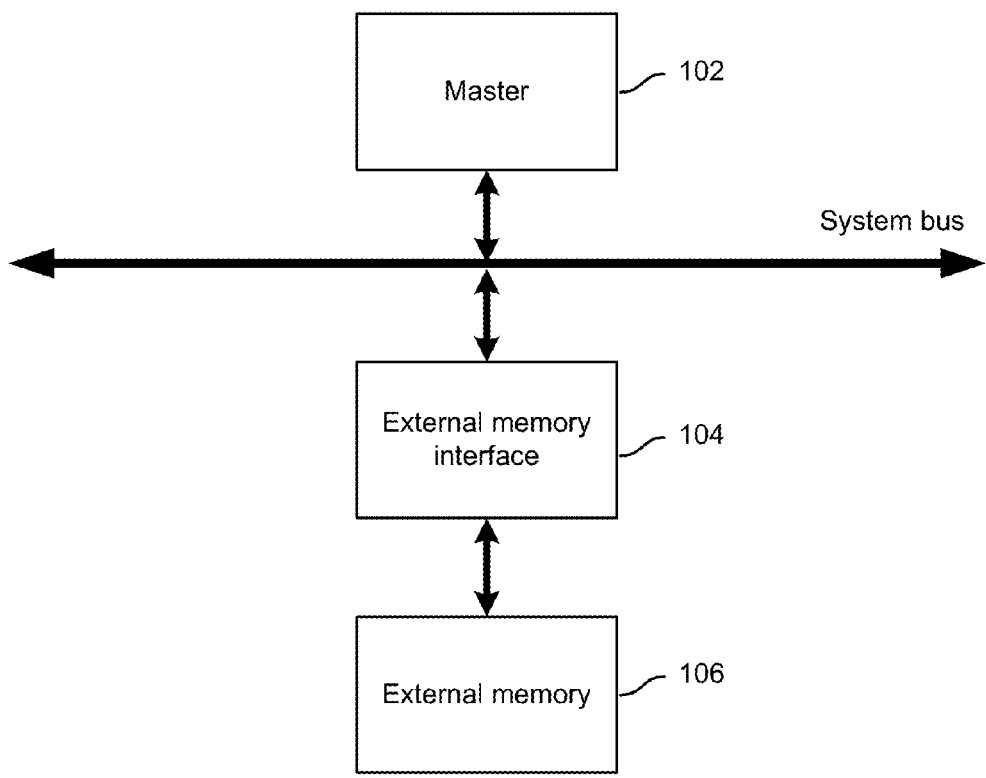
FIG. 1A is a diagram showing an example of a system of memory access.

FIG. 1A is a diagram showing an example of a system of memory access. As shown in FIG. 1A, master 102 (e.g., a microprocessor) sometimes needs to access external memory 106 (as opposed to a local memory) via external memory interface 104 for data that it has been requested to process (e.g., by a software application). For example, master 102 can fetch and execute instructions from external memory 106, read and process data from external memory 106, and also write new data to external memory 106.

Figure 1B:
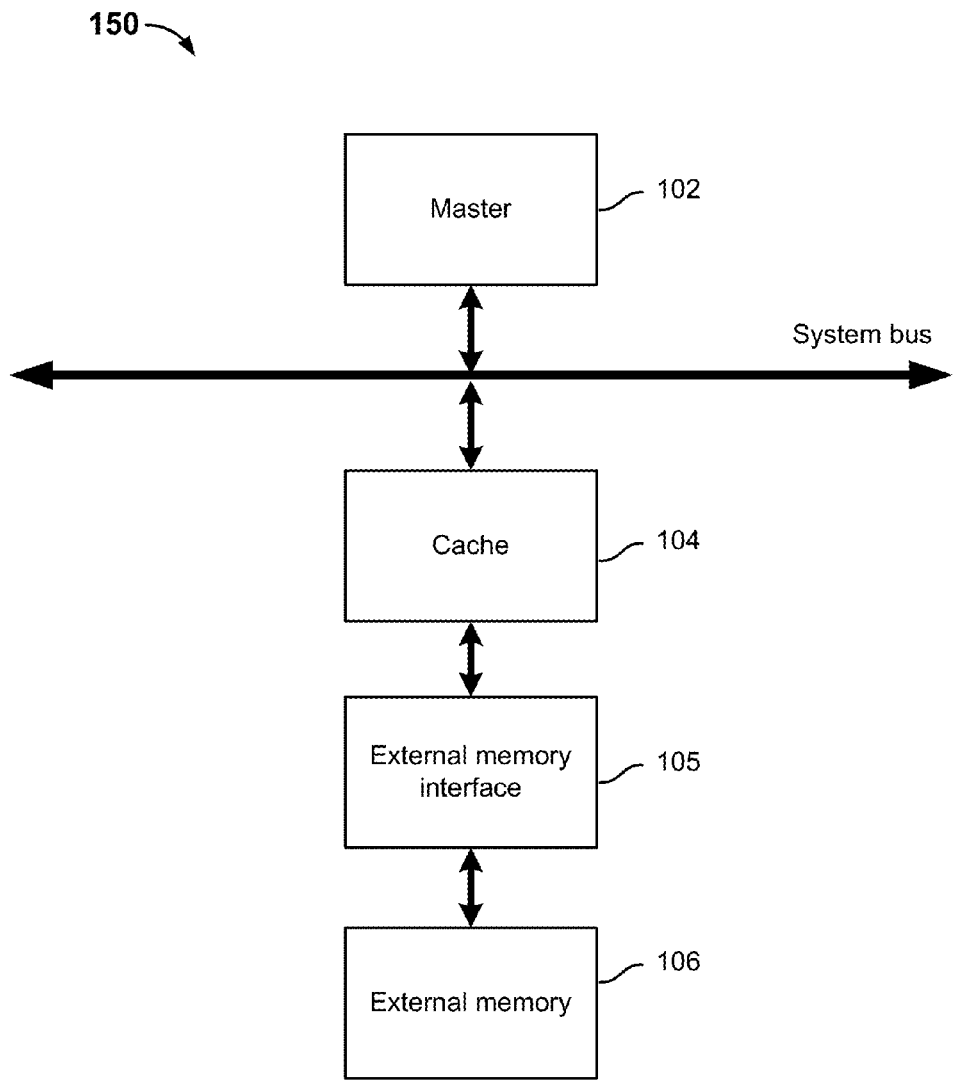
FIG. 1B shows an example of a system where cache 105 is added between master 102 and external memory interface 104.

Often, the access time at a main memory such as external memory 106 is slow compared to the speed of a master such as master 102. Furthermore, the main memory may also have long access latencies. So the difference in speeds between the master and the main memory could significantly decrease the performance of the system. To mitigate this problem, some systems have added a cache between the master and the main memory. Typically, the cache has a faster access time than the main memory and so is used to store recently used data. FIG. 1B shows an example of a system where cache 104 is added between master 102 and external memory interface 105.

Even though it would be desirable to access data from systems such as 150 of FIG. 1B with minimum error, memory such as Dynamic Random Access Memory (DRAM) is prone to error. For example, the cells of the memory can be affected by alpha particles, which can corrupt the data and introduce soft error. Also, for example, there could be physical defects inside the memory that cannot be fixed, which is a form of hard error. In another example, the main memory module may be located off-chip and as a result, signal integrity and noise issues can arise with respect to the memory interface when data is transferred. To reduce error, a memory protection scheme that detects and corrects any error during the transfer of data from and to the memory can be used.

In some systems, error correction code (ECC) or parity bits are added for each accessible size of data to avoid extra read-modify-writes. However, a caveat in this technique is that it requires increasing the memory interface data bus width. For example, if the master were a microprocessor, assume that the microprocessor reads and writes to the memory with a single 8-bit, 16-bit, or 32-bit transfer or multiples of 32-bit bursts. In this example, the smallest accessible size of data is 8 bits. One extra parity bit could be generated for each 8-bit data and the parity bits are typically stored together with their corresponding data in the memory. However, typically, the additional parity bits are stored together with their corresponding data in the memory in a manner that would change the architecture of the bus interface. For example, if the original memory bus interface is 32 bits wide, then adding parity bits to the memory in this case would require changing the memory interface from 32-bits to 36-bits (i.e., one parity bit is added for each 8 bits of data). Note that a 1-bit parity scheme can only provide 1-bit detection capability. In order to support multiple bits of error detection and correction, more parity bits are needed for each 8 bits of data. For example, to provide 2-bit error detection and 1-bit error correction for 8 bits of data, a 5-bit parity would be needed for each 8 bits of data, which would significantly increase the memory interface data bus width. These kinds of changes in data bus architecture are often not preferred. Furthermore, the memory may not support the new bus width. Certain types of memory may only support certain fixed width configurations such as 16-bits or 32-bits. Moreover, there is large memory storage overhead for storing these extra parity bits. In this example, the memory storage overhead for the parity bits is 62.5% (i.e., the ratio of 5 bits of parity for every 8 bits of data yields 62.5%).

In another approach, extra parity bits are stored in locations in memory that are different than the locations at which the corresponding data is stored. In this case, the microprocessor, for example, would need to generate extra accesses to read the parity to check for error, and also extra write accesses to update the parity bits for each user data write. While this approach does not require changes to the architecture of the memory interface bus width, it could complicate the microprocessor's access sequences. Complicating the microprocessor's access sequences could decrease the system's performance because extra accesses to memory are needed. Also, the original software code executed by the microprocessor may also need to be changed in order to generate the new parity accesses and to check for error.

A cache scheme that includes adding an error correction code that protects each block of data in memory and permits two types of accesses to data in memory is disclosed. In some embodiments, a first type of access to data made via a Cache Access Region remaps the logical address of the request into a physical address that is used to access the data and a second type of access to data made via a Direct Access Region does not remap the logical address but rather uses the logical address as the physical address to access the data. In some embodiments, data at memory is accessed in relatively small sizes and the requestor for data from the memory does not need to wait for an interrupt per completion of data transfer.

Figure 2:
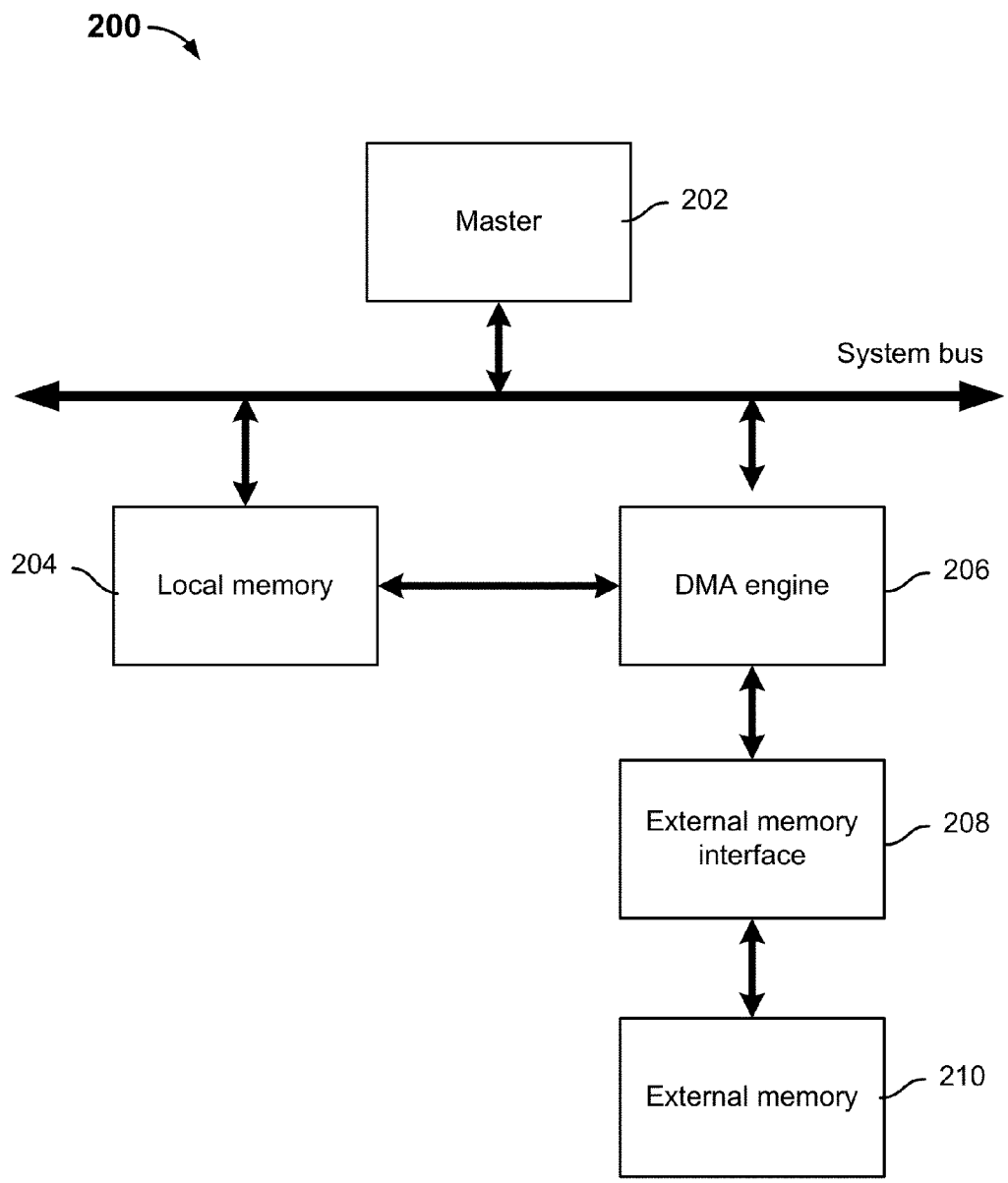
FIG. 2 is a diagram showing an example of a system of memory access with a DMA engine.

FIG. 2 is a diagram showing an example of a system of memory access with a DMA engine. In system 200, master 202 accesses data at external memory 210 through interacting with DMA engine 206 and local memory 204. Examples of master 202 can include a microprocessor, digital signal processor, a sequencer, or state machine. Examples of external memory 210 can include double data rate synchronous dynamic random access memory (DDR SDRAM), synchronous dynamic random access memory (SDRAM), or static random access memory (SRAM). Local memory 204 can provide the functionalities of a cache.

Master 202 could receive an instruction (e.g., from a software application) to access data at external memory 210. Master 202 then executes code (e.g., firmware) to perform either a read or write operation at external memory 210 based on the instruction. The firmware would program DMA engine 206 with the parameters of the read or write operation. Such parameters can include a read command (if the operation were a read operation) that instructs DMA engine 206 to transfer data from external memory 210 to local memory 204, a write command (if the operation were a write operation) that instructs DMA engine 206 to transfer data from external memory 210 to local memory 204, source starting address, destination starting address, and the size of the data to be accessed, for example. After master 202 programs DMA engine 206 with parameters, DMA engine 206 performs the data access based on the given parameters. Once DMA engine 206 completes the data access, DMA engine 206 sends an interrupt to master 202 to indicate such completion. If the operation were a read operation, master 202 would need to read the requested data from local memory 204, where it was written by DMA engine 206. As master 202 waits for the interrupt, it could perform other functions while the data access is being handled by DMA engine 206.

As shown in the example, in the system of memory access that includes master 202 interacting with DMA engine 206, master 202 is required to expend resources to provide fairly specific parameters to DMA engine 206 such as the size of the data to access, at which starting address to find the data, at which destination address to find the data, and how the data is arranged at external memory 210 (e.g., whether ECC is included at external memory 210 and if so, in which manner). Furthermore, DMA engine 206 is typically suitable for transferring large blocks of data. This is because DMA engine 206 uses an interrupt to signal to master 202 that it has completed the transfer of data; the use of an interrupt is associated with high overhead, which is why it is more worthwhile to use DMA engine 206 for the transfer of bigger blocks of data. Therefore, system 200 suffers from requiring master 202 to execute more complicated firmware code and is also less appropriate to access small blocks of data for the reasons discussed above.

Figure 3:
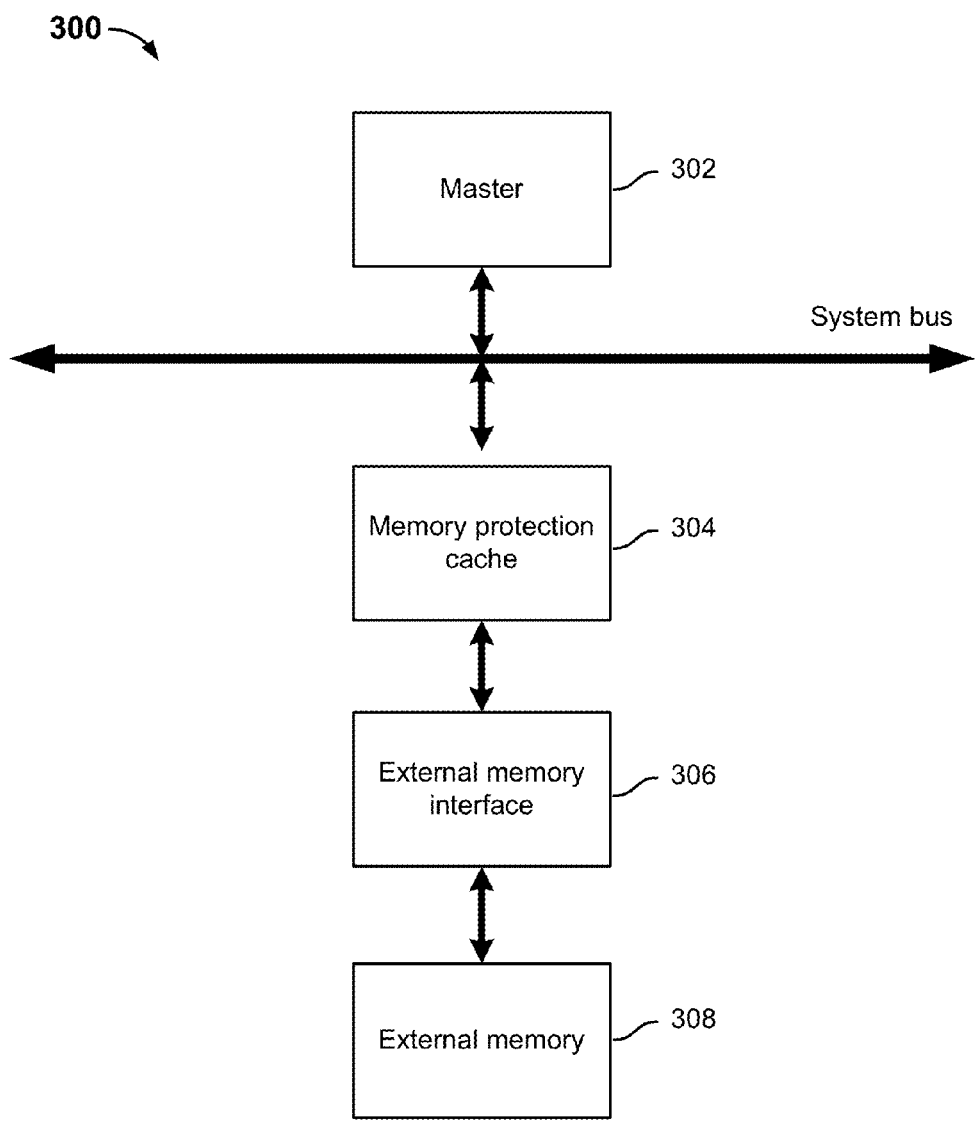
FIG. 3 is a diagram that shows an embodiment of a system for memory access with a memory protection cache.

FIG. 3 is a diagram that shows an embodiment of a system for memory access with a memory protection cache. In system 300, master 302 accesses data at external memory 308 through interacting with memory protection cache 304. Examples of master 302 can include a microprocessor, digital signal processor, a sequencer, or state machine. Examples of external memory 308 can include double data rate synchronous dynamic random access memory (DDR SDRAM), synchronous dynamic random access memory (SDRAM), or static random access memory (SRAM).

Memory protection cache 304 is a logic block that can be implemented with one or more of hardware and software. In various embodiments, memory protection cache 304 includes local memory of which at least a portion can be implemented as a cache. Memory protection cache 304 is configured to facilitate master 302 access to data at external memory 308 by requiring minimal instruction (e.g., from the firmware associated with) from master 302. In various embodiments, in a memory access system with a memory protection cache such as memory protection cache 304, master 302 can provide memory protection cache 304 with a request (e.g., a read or write operation) for data at a particular logical address at external memory 308 and memory protection cache 304 can then perform the request with respect to external memory 308 without requiring master 302 to program parameters associated with the request at, for example, a DMA engine. In various embodiments, in response to a request (e.g., a logical address at which the desired data is located at external memory 308) for data from master 302, memory protection cache 304 returns the data to master 302 without requiring master 302 itself to actively read the data, for example, from a local memory.

In some embodiments, in system 300, external memory 308 includes ECC that is arranged next/sequential to its corresponding block of data. In various embodiments, at least a portion of data at external memory 308 is stored in blocks of a predetermined size. In various embodiments, memory protection cache 304 accesses data at external memory 308 at the minimum unit of a predetermined block size. In some embodiments, the predetermined size of the data blocks is larger than the smallest accessible size of data at external memory 308. For example, the predetermined size of each data block can be a cache line and for each cache line of data, a corresponding set of ECC (i.e., ECC that is configured to protect that particular cache line) is stored at a physical address at external memory 308 that is in sequence with a starting or ending physical address of the data it is configured to protect. One benefit in adding ECC in sequence with its corresponding data is that the external memory interface bus does not need to be changed. In some embodiments, the ECC that is added among the data at external memory 308 is not seen by master 302 when it requests data at external memory 308 during normal operation (i.e., when master 302 requests data via the Cache Access Region, as discussed below). The addition of ECC in sequence with corresponding data shifts the physical addresses of the data (because the ECC is inserted between blocks of data such that each block of data is separated by a set of ECC), but master 302 still sees a continual logical address space of the data (i.e., master 302 cannot see the ECC) when it accesses data via the Cache Access Region; to enable this, memory protection cache 304 remaps a logical address associated with data that is requested by master 302 via the Cache Access Region to the physical address of the data in the event the physical address of the data is not the same as the logical address due to the addition of ECC among the data.

In various embodiments, using memory protection cache 304, master 302 does not need to be aware and/or have awareness of the manner in which data and/or ECC is arranged at external memory 308. In some embodiments, as discussed further below, master 302 has at least two different address spaces (for enabling two different types of accesses) for accessing data at external memory 308; the first address space is referred to herein as the Cache Access Region and the second address space is referred to herein as the Direct Access Region. A difference in requesting data via the Cache Access Region or the Direct Access Region is the following: when data at a logical address is requested via the Cache Access Region, memory protection cache 304 first performs a remapping of the requested logical address to a physical address to which the data at the requested logical address is actually located as a result of the disclosed insertion of ECC; whereas when data at a logical address is requested via the Direct Access Region, memory protection cache 304 does not perform a remapping of the logical address and instead uses the logical address as the physical address at which to access data.

As a result of a request by master 302 for data via the Cache Access Region, memory protection cache 304 accesses data and its corresponding ECC at external memory 308 and checks the data for the presence of a correctable error using the corresponding ECC, while the presence of the ECC is transparent to master 302. Put another way, when master 302 requests data via the Cache Access Region, it can send a logical address associated with the request to memory protection cache 304 without knowledge of the presence and/or use of ECC at external memory 308. If there is no error in the accessed data or if the error is correctable, then the requested portion of the accessed data is stored in the cache of memory protection cache 304 (e.g., when the cache of the local memory of memory protection cache 304 is enabled). Next, if the request were a read operation, then the requested portion of the accessed data is returned from cache to master 302. Otherwise, if the request were a write operation, then the data associated with the request is used to update at least a portion of the accessed data that is stored in cache. At some point, a new ECC corresponding to the updated data is generated and both the updated data in cache (which is marked as "dirty") and the new ECC are written back to a corresponding address in external memory 308. In short, by requesting data via the Cache Access Region in system 300, master 302 is able to efficiently perform a data request at external memory 308 with the benefit of ECC protection at external memory 308 without the need to program specific parameters into a DMA engine or the need to wait for an interrupt when the data transfer is complete, as would have been needed for a different system such as system 200.

In comparison, as a result of a request by master 302 for data via the Direct Access Region, memory protection cache 304 accesses data and any corresponding ECC that is associated with the requested address at external memory 308 and returns the data and the ECC, if any. In some embodiments, the data and/or ECC is returned to master 302. In some embodiments, the data and/or ECC is returned to an entity other than master 302 (e.g., a debugging program that made the request). In one example, the debugging program can be part of a firmware program that executes at master 302 or is part of a special configuration that is executed by master 302. Master 302 may execute the testing code or is configured to be in a debug mode for debugging purposes. In some embodiments, because the data was accessed via the Direct Access Region, it is not cached nor checked for error. One purpose of the Direct Access Region is that it can be used to access and return data and even ECC directly from external memory 308 so that the data and/or ECC can be analyzed, for example, when a special condition (e.g., that indicates an abnormal operation) arises. For example, a special condition can be if in a previous access to data via a Cache Access Region, memory protection cache 304 determined that the accessed data has uncorrectable error. In this example, the same data and its corresponding ECC that caused the error uncorrectable status to arise can be accessed via the Direct Access Region so that the data can be processed and corrected. In short, with the availability to access and receive both data and ECC via the Direct Access Region, both the data and ECC at external memory 308 can be examined outside of the normal operation of reading and writing data to external memory 308.

Figure 4:
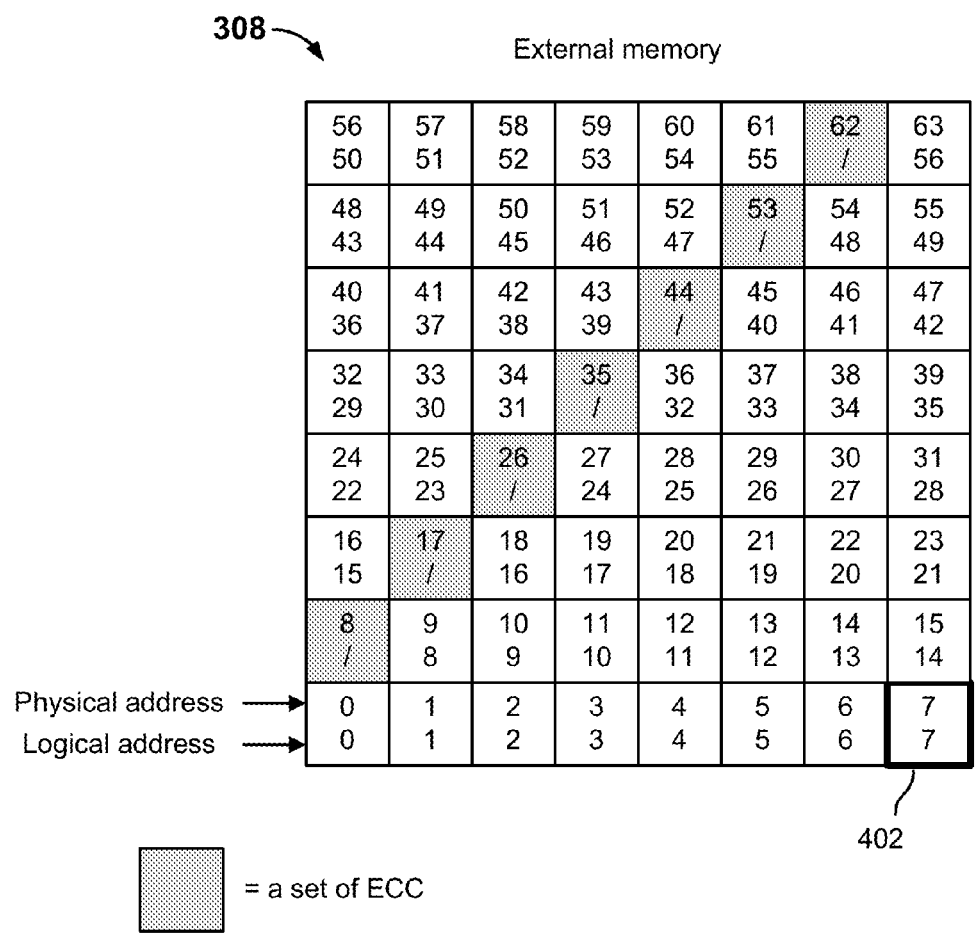
FIG. 4 is an example of external memory with ECC inserted among the data.

FIG. 4 is an example of external memory with ECC inserted among the data. In some embodiments, the example of FIG. 4 can be used to implement external memory 308 of system 300. As shown in the example, the ECC is inserted in between blocks of data. In some embodiments, at the external memory, each set of ECC is configured to protect a block of data that is of a predetermined size. In some embodiments, the size of the block of data can be predetermined by a system administrator. In some embodiments, the size of the block of data is predetermined to be larger than the size of the smallest unit of accessible data because it is more efficient (in terms of how much ECC is needed to be added to the external memory in proportion to the amount of protected data) to protect an entire block of data using one set of ECC rather than to protect the smallest unit of accessible data with one set of ECC. Assume, for example, that if the smallest accessible size were 8 bits of user data, 5 bits of ECC are used to protect it. And also assume, for example, that if the block of data were chosen to be 8×32 bits, then 32 bits of ECC are chosen to protect it. In this example, the ratio of ECC bits to user data is much bigger for the case of 8 bits of user data and 5 bits of ECC, meaning there would be less space available for user data at the memory if the ECC were used to protect data for each 8 bits of data (if 8 bits of data were the smallest accessible size of data).

In some embodiments, when data at the external memory is requested via the Cache Access Region, only entire blocks of data (rather than portions of blocks of data) and their corresponding set of ECC can be read from the external memory. The entire blocks of data are checked for correctable error and corrected with ECC, if applicable, and then stored in the cache (when it is enabled) of the memory protection cache. Once stored in cache, the portions of the data in the entire blocks of data that are relevant to the request are used to complete the request (e.g., if the request were a read operation, then the relevant portions of data would be returned to the master and if the request were a write operation, then the relevant portions of data would be updated with the new data of the request).

In the example of FIG. 4, each block of data is a cache line that consists of eight sequential 32-bit words of data (it can be assumed that in the example, the size of the smallest unit of accessible data is 32-bits). In the example, each 32-bit word of data is represented by a rectangle such as rectangle 402; so a cache line comprises eight sequential rectangles. In the example, a set of ECC that corresponds to a cache line of data (i.e., the cache line of data that the set of ECC is configured to protect) also comprises a 32-bit word of data. So, in this example, the ratio of ECC to corresponding data is 1/8, which makes the memory overhead of this example 12.5%. While in this example, the size of the set of the ECC is equal to the size of each word of data in a block of data, the size of the ECC can be any size that is chosen (e.g., based on the desired degree of error correction). As shown in the example, a word of (non-ECC) data at the external memory can be identified by both a physical address and a logical address while each set of ECC is identified by only a physical address. Each block of data can be identified, for example, by the start and/or end logical/physical addresses associated with that block or the set of data that encompasses the data over a range of logical/physical addresses.

In some embodiments, the size of the block of data can be predetermined (e.g., by a system administrator) to be a power of two. By selecting a block size that is a power of two and using one extra word of data for the corresponding set of ECC, for a request via the Cache Access Region, the logical address of the master's request can be easily remapped to the physical address. For example, the remapping can be accomplished using one adder in hardware. In the example, the cache line size is 8×32-bits, 1×32-bits of ECC are used per cache line, and the ECC is stored sequential to the protected cache line. Given that the ECC is stored sequential to the protected cache line in this example, the address remapping can be determined by the following formula, for example:

$$\text{Physical Address} = \text{Logical Address} + [(\text{Logical Address})/8] \quad (1)$$

For example, to implement "(Logical Address)/8," the Logical Address bits can be shifted to the right by 3 bits (e.g., using a fixed 3-bit right-shift operation in hardware). However, in some embodiments where the ECC is not stored sequential/next to the protected block of data, then an equation other than equation (1) may be used to implement the address remapping.

In various embodiments, the set of ECC that corresponds to a block of data (e.g., a cache line of data) is stored at a physical address that is sequential/next to (a word of data that is included in) that block of data. In the example, a set of ECC is shown to be sequential/next to the corresponding block of data. For instance, the set of ECC corresponding to the cache line block of data that includes words of data at the range of physical addresses of 0 to 7 is located at physical address 8. So, if at least a portion of the block of data that encompasses the data at the physical addresses from 0 through 7 is requested, then that block of data along with the corresponding set of ECC at physical address 8 would be accessed by the memory protection cache.

In some embodiments, the set of ECC that corresponds to a block of data does not need to be stored at a physical address that is sequential/next to that block of data. However, an advantage to storing the set of ECC next to the corresponding block of data is that it permits retrieval of or writing of data at that block and the corresponding set of ECC to be done in a single access/burst request to the external memory (as opposed to a set of ECC that is not stored sequential/next to the block of data, which would cause more than one access/burst request to the external memory). In this example, a "/" indicates an ECC word, which is not accessible by a logical address, e.g., via the Cache Access Region.

Figure 5:
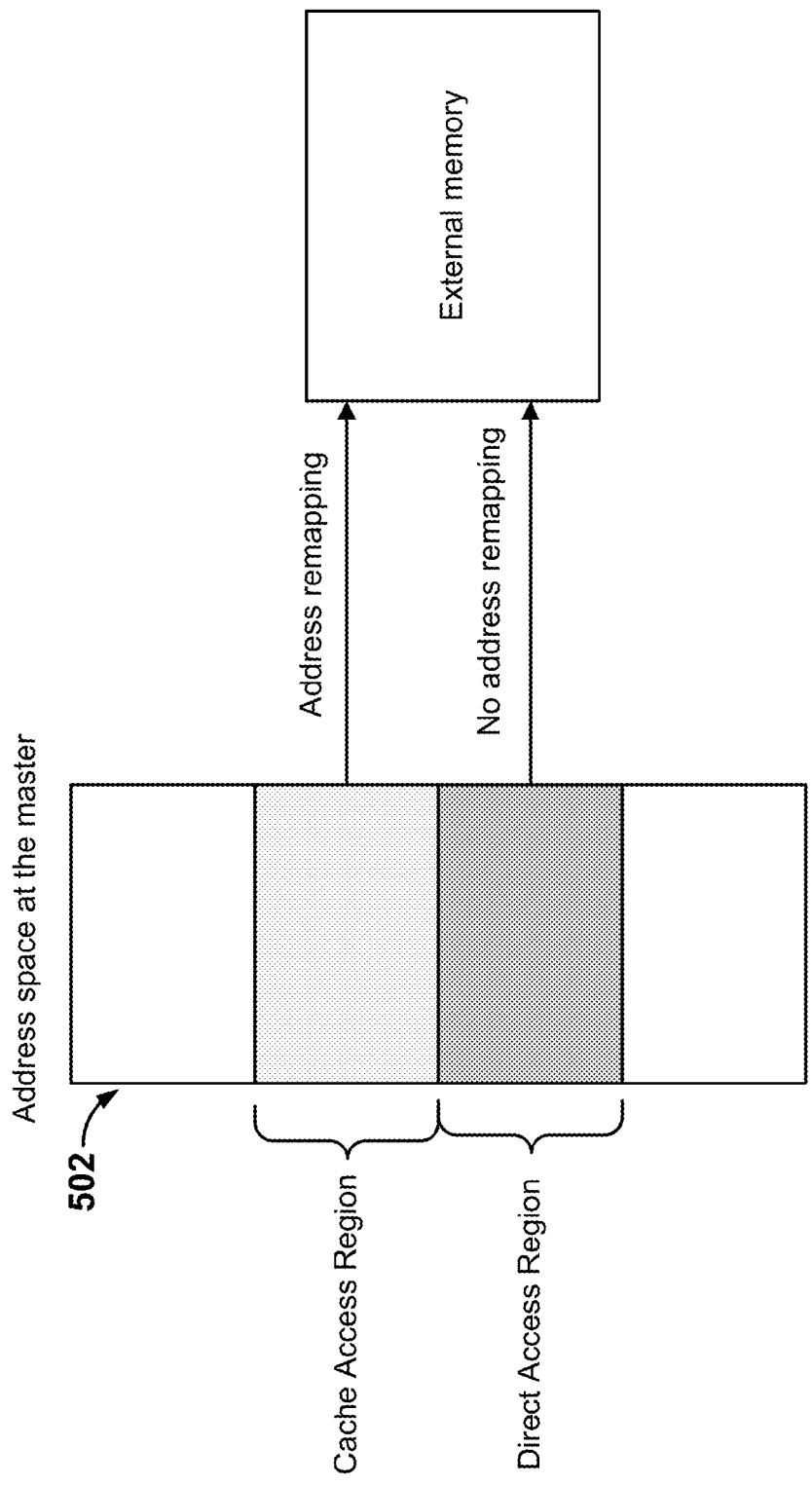
FIG. 5 is an example of different regions at the address space of the master.

FIG. 5 is an example of different regions at the address space of the master. In the example of FIG. 5, multiple regions can be defined at the address space of the master. In some embodiments, master 302 of system 300 can use an address space such as address space 502. In the example, two regions are shown: 1) the Cache Access Region and 2) the Direct Access Region. Both the Cache and Direct Access Regions can be used to access the external memory but each has different properties. As mentioned above, if the master accesses the external memory through the Cache Access Region, then the requested logical address is remapped into a physical address. The block(s) of data associated with the physical address and the corresponding set(s) of ECC are read from the external memory, checked for error using the corresponding set(s) of ECC, and stored into the cache of the memory protection cache. Also as mentioned above, if the master accesses the external memory through the Direct Access Region, then the requested logical address is not remapped, and instead the same logical address is used as the physical address. The block(s) of data associated with the physical address and the corresponding set(s) of ECC are returned to the master (or other logic block/process) for further handling but not necessarily stored in cache or checked for error.

In some embodiments, an alias space is defined for the Direct Access Region so that the master can perform raw access to data and its corresponding ECC from the whole physical space of the external memory. Whereas the ECC corresponding to each block of data at the external memory was transparent to the master when a request was made via the Cache Access Region, the ECC corresponding to each block of data is visible to the master when a request is made via the Direct Access Region.

In some embodiments, during normal operation (e.g., when a master makes a request to read or write data at the external memory), the master accesses the external memory via the Cache Access Region and during operation that is other than normal (e.g., subsequent to receiving a status of uncorrectable error of data requested via the Cache Access Region), the master can access the external memory via the Direct Access Region to see even the ECC. By performing such a raw access to data via the Direct Access Region, the accessed data can be analyzed and/or debugged, for example, to correct any errors in the data. In some embodiments, data can also be accessed via the Direct Access Region for reasons other than debugging. For example, data can be accessed via the Direct Access Region for testing purposes; a test program can use the Direct Access Region to intentionally modify ECC only or modify one particular word of data without updating the ECC for the purpose of creating data corruption for testing. Also, data can be accessed via the Direct Access Region for initializing the memory (including the ECC locations) with known data.

For example, to access data via a particular region of the address space, the master can send a request that includes a logical address that is the base address of the desired region plus the offset at which the data is sought. In a specific example, assume that the external memory has address 0 to 511. Also, assume that the whole address space as seen by the master is 0 to 9999. If the Direct Access Region started from address 1000 (i.e., the Direct Access Region base address) of the address space of the master, then the address region 1000 to 1511 can be defined as the Direct Access Region. The master would use address (Direct Access Region base address plus the offset) "1000+2 (=1002)" to access the external memory at logical address 2 using the Direct Access method (data is accessed at the physical address of 2 because no remapping is done in the Direct Access Method). If the Cache Access Region started from address 2000 (i.e., the Cache Access Region base address) of the address space of the master, then the address region 2000 to 2511 can be defined as the Cache Access Region. The master would use address (Cache Access Region base address plus the offset) "2000+2 (=2002)" to access the external memory at logical address 2 using the Cache Access method.

For example, assume that the master requests to access data at address 8. Referring to the example of external memory of FIG. 4, if the master made this request via the Cache Access Region (e.g., the request is for Cache Access Region base address +offset of 8), then the logical offset 8 is remapped to physical address 9 and the data at physical address 9 is accessed. Otherwise, if the master made this request via the Direct Access Region (e.g., the request is for Direct Access Region base address +offset of 8), then the data at physical address 8 (ECC) is returned because no remapping is performed.

Figure 6:
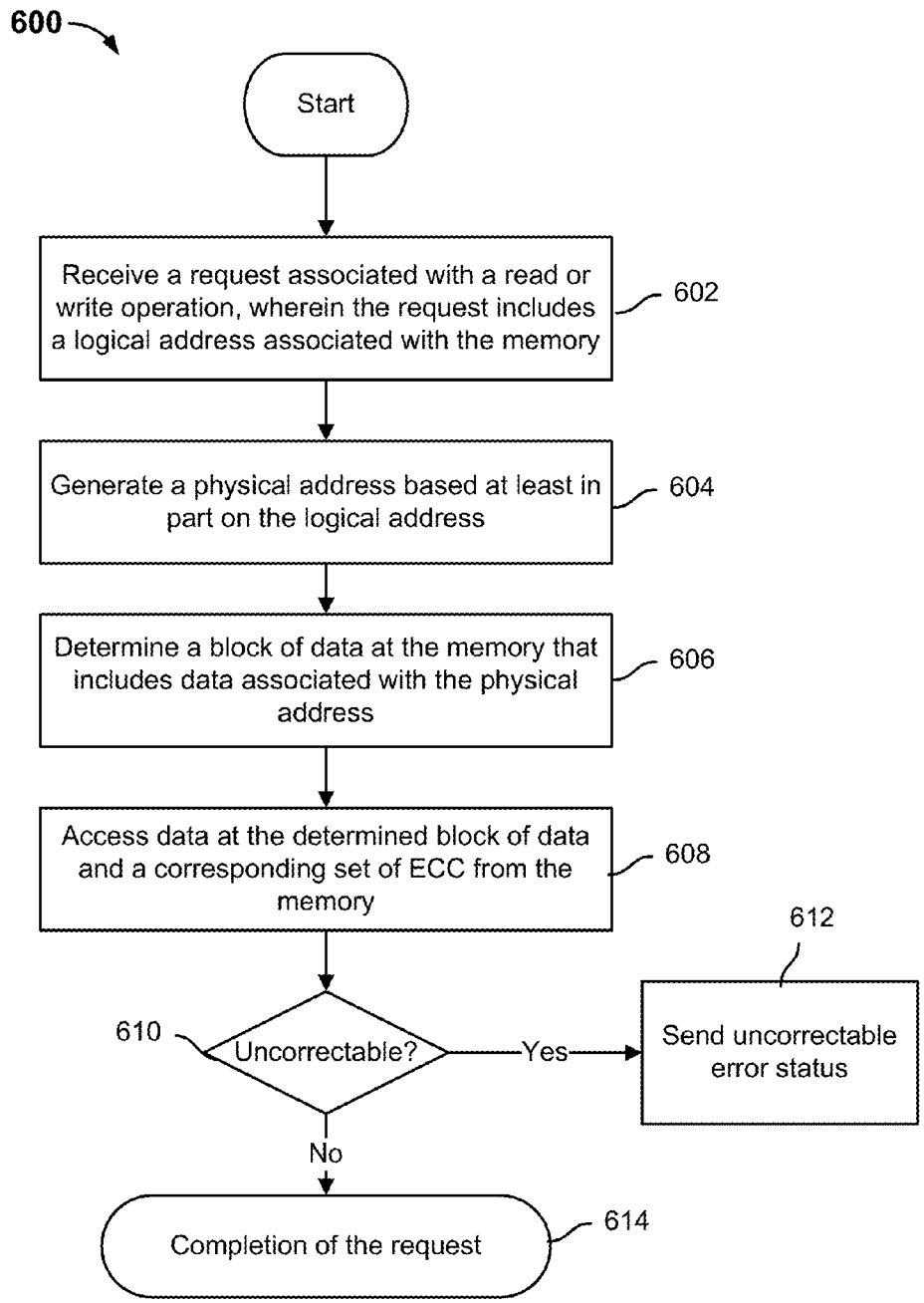
FIG. 6 is a flow diagram showing an embodiment of a process of memory access.

FIG. 6 is a flow diagram showing an embodiment of a process of memory access. In some embodiments, process 600 can be implemented by a memory protection cache such as memory protection cache 304 of system 300. In some embodiments, process 600 is implemented for a request associated with a read miss or a write miss at the cache of the memory protection cache such that the memory needs to be accessed. What is not shown in process 600 is a request associated with a read hit or write hit at the cache for which the memory would not need to be accessed because the requested data could be directly read from/written to in the cache without interaction with the memory.

At 602, a request associated with a read or write operation is received, wherein the request includes a logical address associated with the memory. For example, a master receives an instruction from a software application to access data at the memory and then the master sends a request associated with a read or write operation to the memory protection cache based on the instruction. The request includes a logical address associated with the location of the data that is desired to be accessed. In various embodiments, the request is made via the Cache Access Region (e.g., during this normal operation of memory access).

At 604, a physical address is generated based at least in part on the logical address. For example, the physical address can be generated by remapping the logical address with a mapping scheme (e.g., the remapping technique as illustrated in formula (I) above). The purpose of remapping the logical address to the physical address is to locate the data that is identified by the logical address to the master but has shifted in physical location at the memory due to the addition of the ECC.

At 606, a block of data at the memory that includes data associated with the physical address is determined. In various embodiments, the memory protection cache only accesses data from the memory in blocks of a predetermined size. The data associated with the generated physical address (i.e., the request) could be included with one or more blocks of data. For example, if data associated with the request were included within one block of data at the memory, then that block of data is determined. But if the data associated with the request were included within more than one block of data at the memory, then those multiple blocks of data can be determined.

At 608, data at the determined block of data and a corresponding set of ECC are accessed at the memory. In various embodiments, a corresponding set of ECC is stored for each block of data at the memory. When a block of data is accessed, so is its corresponding set of ECC.

Figure 7:
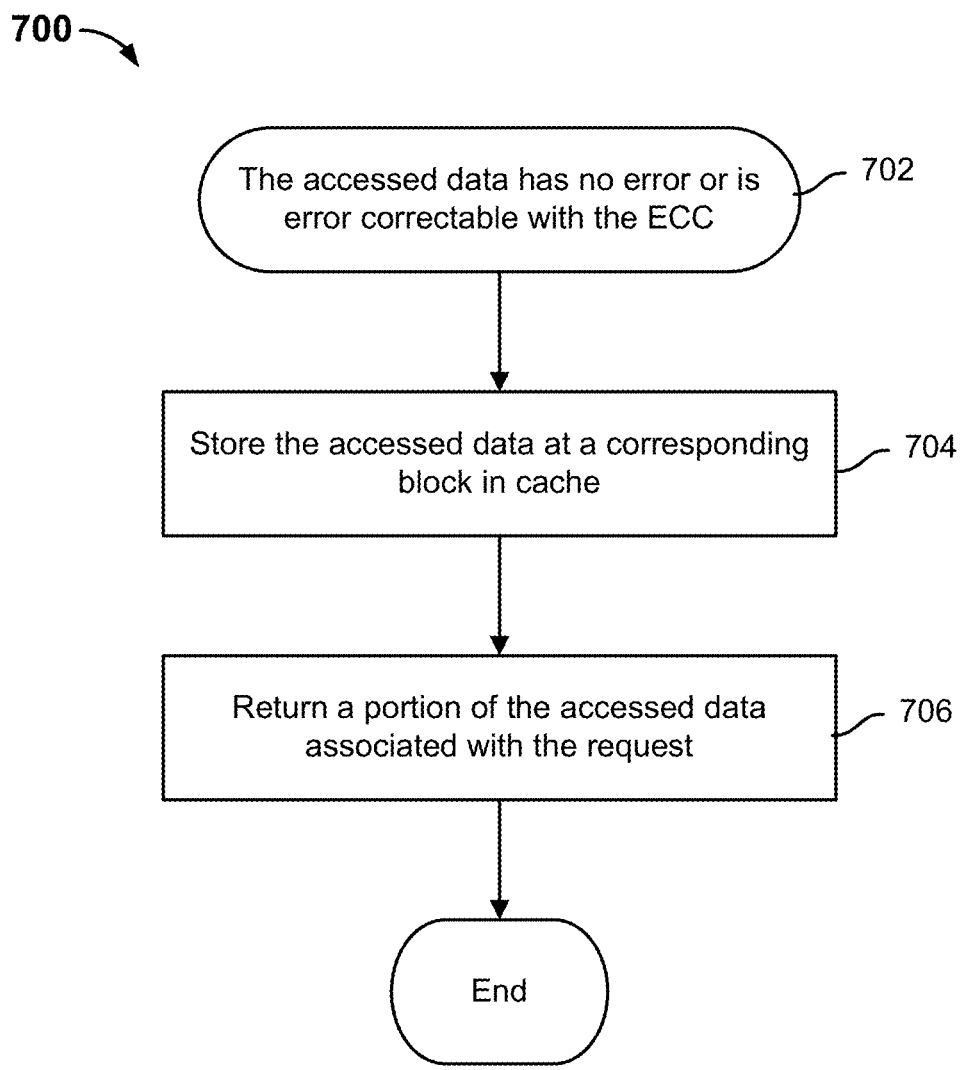
FIG. 7 is a flow diagram showing an embodiment of a process for reading data from memory.
Figure 8:
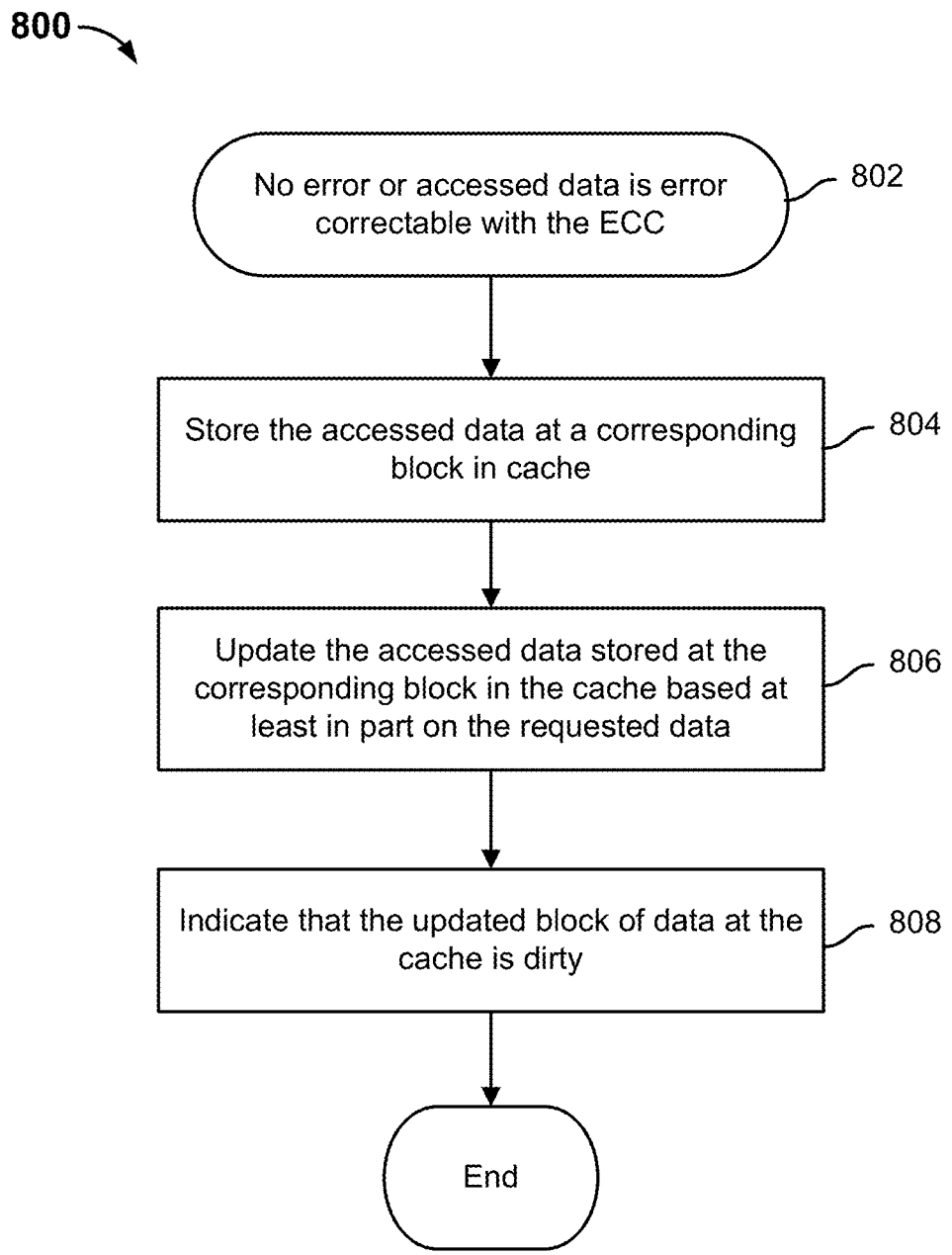
FIG. 8 is a flow diagram showing an embodiment of a process for writing data to memory.

At 610, it is determined whether the accessed block of data has an uncorrectable error. In various embodiments, the accessed block of data requested via the Cache Access Region is checked for error. In the event that it is determined that the block of data has no error (e.g., the data can be successfully decoded) or it is determined that the block of data has correctable error (e.g., the data can be successfully decoded after being corrected with the corresponding set of ECC), control passes to 614. At 614, the completion of the request is based on whether the request is associated with a read operation or a write operation. An example of the completion of a request associated with a read operation is shown in FIG. 7 and an example of the completion of a request associated with a write operation is shown in FIG. 8. In the event that it is determined that the block of data has uncorrectable error (e.g., the data cannot be successfully decoded even after the data was corrected with the corresponding set of ECC), then control passes to 612.

At 612, an indication of an uncorrectable error status is sent. In some embodiments, the indication of the uncorrectable error status is sent to the master. In some embodiments, in response to receiving this indication, the master takes further action, such as the example illustrated in FIG. 12.

FIG. 7 is a flow diagram showing an embodiment of a process for reading data from memory. In various embodiments, process 700 continues at 614 of process 600. In some embodiments, process 700 can be implemented at system 300. In some embodiments, process 700 can be performed by a memory protection cache such as memory protection cache 304 of system 300.

At 702, the block of data accessed from the memory is determined to have no error or error that is correctable with its set of corresponding ECC.

At 704, the accessed data is stored at a corresponding block in the cache. In various embodiments, the cache of the memory protection cache is enabled so that data can be stored there. In various embodiments, the cache includes areas that mirror the arrangement of the blocks of data and, in some embodiments their corresponding sets of ECC, at the memory. So when a block of data is accessed from the memory, it can be stored at a location (block) in the cache that corresponds to the location (block) from where it was accessed at the memory. In some embodiments, the accessed data is stored at a location in cache based on a particular replacement policy. In some embodiments, the accessed data is stored at any available location in cache. In some embodiments, the corresponding set of ECC that is accessed with the data is also stored at the cache.

At 706, a portion of the accessed data associated with the request is returned. In some embodiments, at least a portion of the data included in a block of data is requested by a read operation. Those portions of the accessed data stored at the cache that are relevant to the read operation are returned to the master that made the request. In various embodiments, the requested data to be read is returned directly to the master without requiring the master to wait to receive an interrupt (e.g., from a DMA engine) and then subsequently read the data from the local memory.

FIG. 8 is a flow diagram showing an embodiment of a process for writing data to memory. In various embodiments, process 800 continues at 614 of process 600. In some embodiments, process 800 can be implemented at system 300. In some embodiments, process 800 can be performed by a memory protection cache such as memory protection cache 304 of system 300.

At 802, the block of data accessed from the memory is determined to have no error or error that is correctable with its set of corresponding ECC.

At 804, the accessed data is stored at a corresponding block in the cache. In various embodiments, the cache of the memory protection cache is enabled so that data can be stored there. In various embodiments, the cache includes areas that mirror the arrangement of the blocks of data, and in some embodiments their corresponding sets of ECC, at the memory. So when a block of data is accessed from the memory, it can be stored at a location (block) in the cache that corresponds to the location (block) from where it was accessed at the memory. In some embodiments, the accessed data is stored at a location in cache based on a particular replacement policy. In some embodiments, the accessed data is stored at any available location in cache. In some embodiments, the corresponding set of ECC that is accessed with the data is also stored at the cache.

At 806, the accessed data stored at the corresponding block in the cache is updated based at least in part on the requested data. In various embodiments, at least a portion of the data included in a block of data is requested to be updated by the write operation. Those portions of the accessed data stored at the cache that are relevant to the write operation are updated (e.g., rewritten/modified) with the new data of the write operation.

At 808, the updated block of data at the cache is indicated as dirty. In various embodiments, a block of data at the cache that is marked as "dirty" will be eventually written back from the cache to the external memory (whereas a block of data that is marked as "clean" will not be written back from the cache to the external memory). For example, a block of data can be marked as "dirty" if a bit associated with that block of data is changed to "1" (whereas a block is marked as "clean" if a bit associated with that block of data indicates "0"). In some embodiments, when a certain condition is met, blocks of data that are marked as "dirty" at the cache are written back to their corresponding locations (blocks) at the memory. One example of a certain condition being met is when the cache is full and/or there is a read miss or write miss at the cache such that data needs to be evicted from the cache so more available space can be made for new data that is requested.

Figure 9:
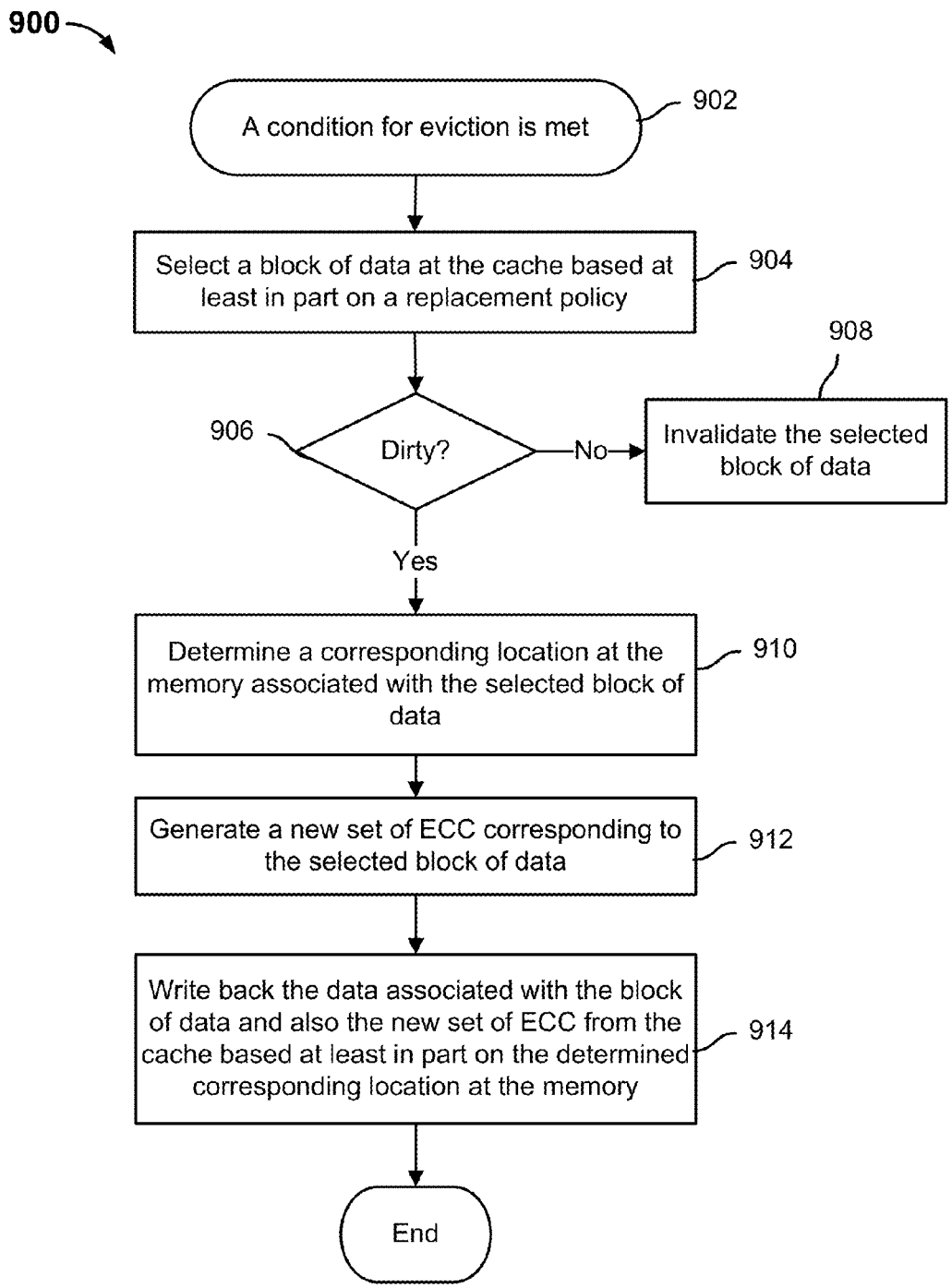
FIG. 9 is a flow diagram of a process for performing eviction at the cache.

FIG. 9 is a flow diagram of a process for performing eviction at the cache. In some embodiments, process 900 can be implemented at system 300. In some embodiments, process 900 can be performed by a memory protection cache such as memory protection cache 304 of system 300.

At 902, a condition for eviction is met. In some embodiments, there is one or more conditions (e.g., configured by a system administrator) that, if at least one is met, eviction is performed at the cache. For example, a condition for eviction is when the cache is full and/or a read miss or write miss at the cache occurs. Eviction entails that one or more blocks of data stored at the cache are to be processed so that new data can be stored at the cache.

At 904, a block of data at the cache is selected based at least in part on a replacement policy. In some embodiments, if the missing data of the write/read miss must be stored at a certain block of data, then that block of data is chosen (e.g., and no replacement policy needs to be used). In some embodiments, if the missing data does not necessarily need to be stored at a certain block, then a conventional replacement policy can be used. For example, a replacement policy can be to choose a least-recently-used block or a block that is selected by round robin. In some embodiments, one or more blocks of data can be selected at the cache for eviction at a time.

At 906, it is determined whether the selected block of data is dirty. In the event that the selected block of data has not been indicated/marked as "dirty" (i.e., it is marked as "clean"), then control passes to 908 and the block of data is invalidated so that it can be written over by newly requested data. By invalidating a block of data, the block of data is marked as being no longer in use so that the space can be filled with new data. For example, a valid bit can be maintained per block of data in cache and the valid bit is set to "1" if the space is filled by new data and set to "0" if the space is no longer used. In the event that the selected block of data has been indicated/marked as "dirty", then control passes to 910.

At 910, a corresponding location at the memory associated with the selected block of data is determined. In some embodiments, the corresponding location (e.g., a set of logical and/or physical addresses) at the memory associated with the selected block of data is determined based on metadata associated with the block of data. In some embodiments, the corresponding location at the memory associated with the selected block of data is determined based on the location at the cache at which the block of data was stored (e.g., if it were designed that each location at the cache corresponds to a particular location at the memory).

At 912, a new set of ECC corresponding to the selected block of data is generated. For example, a set of ECC can be generated using a series of (exclusive-OR) operations using different portions of the block of data and/or other input information.

At 914, the data associated with the block of data and also the new set of ECC are written back from the cache based at least in part on the determined corresponding location at the memory. In some embodiments, the selected block of data is written to the determined corresponding location in memory and the new set of ECC is also written at a location in memory that is proximate to (e.g., next to) where the block of data is written back to.

Figure 10:
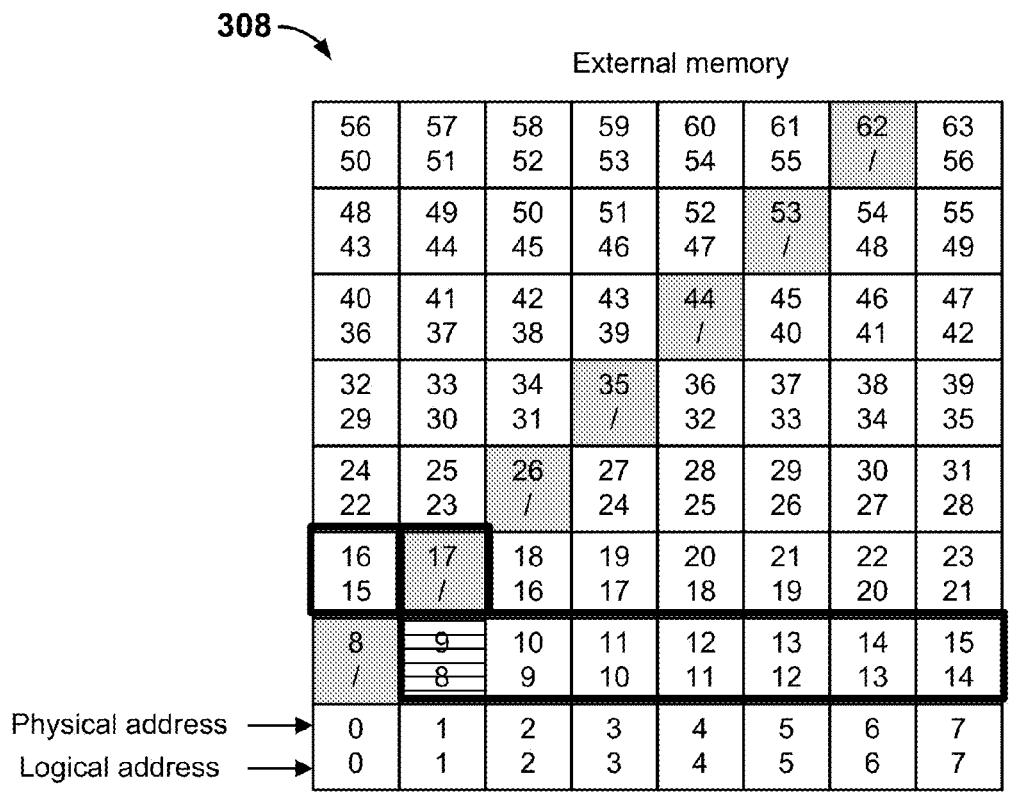
FIG. 10 shows an example in which a word of data at logical address 8 was requested.
Figure 10:
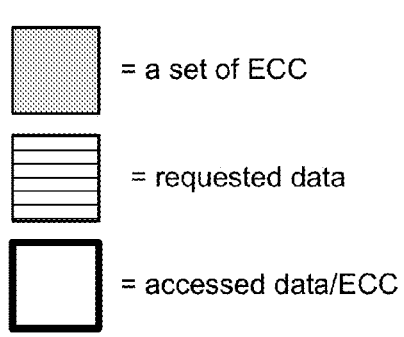

FIG. 10 shows an example in which a word of data at logical address 8 was requested. In the example, each unique logical and physical address identifies a word of data (e.g., comprising 32 bits of data). In the example, each block of data is defined to include eight words of data. In this example, assume that a microprocessor requests to access data at logical address 8 via the Cache Access Region. Assume that the requested data is not already stored at the cache (which is enabled) of the memory protection cache (in the event of a read miss or write miss), so the memory protection cache needs to access the requested data from the memory. The memory protection cache receives the request and because it was made via the Cache Access Region, remaps the logical address to a corresponding physical address. The memory protection cache can use a mapping logic to map logical address 8 to physical address 9. As shown in the example, logical address 8 and physical address 9 points to the same word of data. In this example, the memory protection cache retrieves data in the minimum unit of a block of data and one such block comprises eight words of data. The block of data that includes the word of data at physical address 9 (i.e., logical address 8) is the set of data words that span the range of physical addresses from 9 to 16. In the example, the set of ECC corresponding to the data block located at physical addresses 9 to 16 is located at physical address 17. So, the memory protection cache can retrieve from the memory the block of data at physical addresses 9 to 16 and its corresponding set of ECC at physical address 17. The data retrieved from physical addresses 9 to 16 is checked for error with the corresponding set of ECC that was retrieved from physical address 17. If no error was detected or if correctable error was detected and corrected with the ECC, then the accessed block of data, and in some embodiments its corresponding set of ECC, is stored at a corresponding location in the cache. If the request were a read operation, then the portion of the data at the cache that is relevant to the read request, the data at physical address 9, is read from the cache and returned to the microprocessor. Otherwise, if the request were a write operation, then the portion at the cache that is relevant to the write operation, the data at physical address 9, is updated with data associated with the write operation. The updated block of data is marked as "dirty" so that it will be eventually written back to the external memory at its corresponding location in memory.

Figure 11:
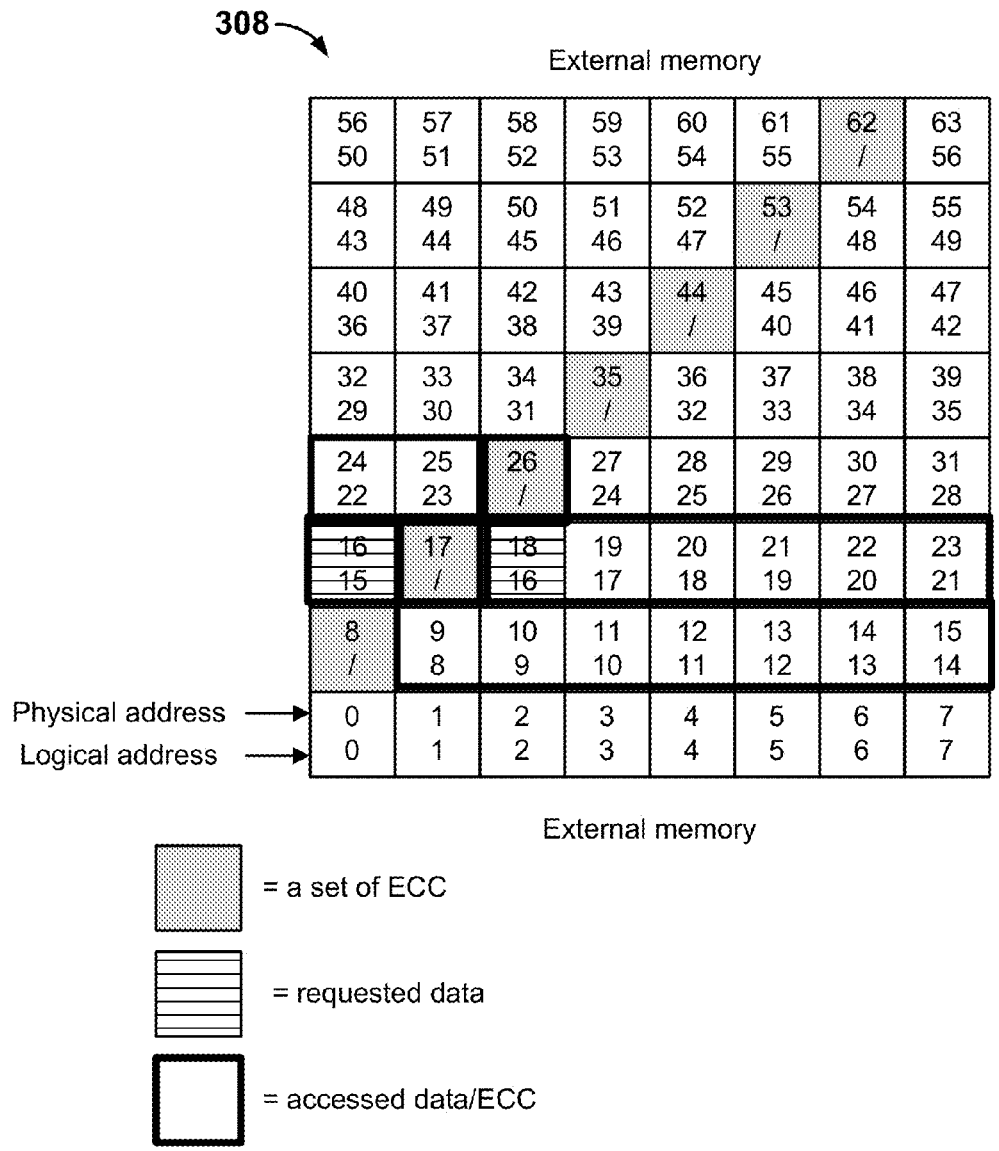
FIG. 11 shows an example in which words of data at logical addresses 15 and 16 were requested.

FIG. 11 shows an example in which words of data at logical addresses 15 and 16 were requested. In the example, each unique logical and physical address identifies a word of data (e.g., comprising 32 bits of data). In the example, each block of data is defined to include eight words of data. In this example, assume that a microprocessor requests to access data at logical addresses 15 and 16 via the Cache Access Region. Assume that the requested data is not already stored at the cache (which is enabled) of the memory protection cache (in the event of a read miss), so the memory protection cache needs to access the requested data from the memory. The memory protection cache receives the request and because it was made via the Cache Access Region, remaps the logical addresses to corresponding physical addresses. The memory protection cache can use a mapping logic to map logical address 15 to physical address 16 and logical address 16 to physical address 18. As shown in the example, logical address 15 and physical address 16 point to the same word of data, as does logical address 16 and physical address 18. In this example, the memory protection cache retrieves data in the minimum unit of a block of data and one such block comprises eight words of data. In this example, the requested data straddles two blocks of data: the first block of data that includes the word of data at physical address 16 (i.e., logical address 15) is the set of data words that span the range of physical addresses from 9 to 16 and the second block of data that includes data at physical addresses 18 (i.e., logical address 16) is the set of data words that span the range of 18 to 25. The set of ECC corresponding to the data block located at physical addresses 9 to 16 is located at physical address 17 and the set of ECC corresponding to the data block located at physical addresses 18 to 25 is located at physical address 26. So, the memory protection cache can retrieve from the memory the blocks of data at physical addresses 9 to 16 and 18 to 25 and their corresponding sets of ECC at physical addresses 17 and 26, respectively. The data retrieved from physical addresses 9 to 16 is checked for error with the corresponding set of ECC that was retrieved from physical address 17 and the data from physical addresses 18 to 25 is checked for error with the corresponding set of ECC from physical address 26. If no error was detected or if correctable error was detected and corrected with the ECC, then the accessed blocks of data and their corresponding sets of ECC are stored at corresponding locations in the cache. If the request were a read operation, then the portions of the data at the cache that is relevant to the read request, the data at physical addresses 15 and 16, are read from the cache and returned to the microprocessor. Otherwise, if the request were a write operation, then the portions at the cache that are relevant to the write operation, the data at physical addresses 15 and 16, are updated with data associated with the write operation. Each updated block of data is marked as "dirty" so that it will be eventually written back to the external memory at its corresponding location in memory.

Figure 12:
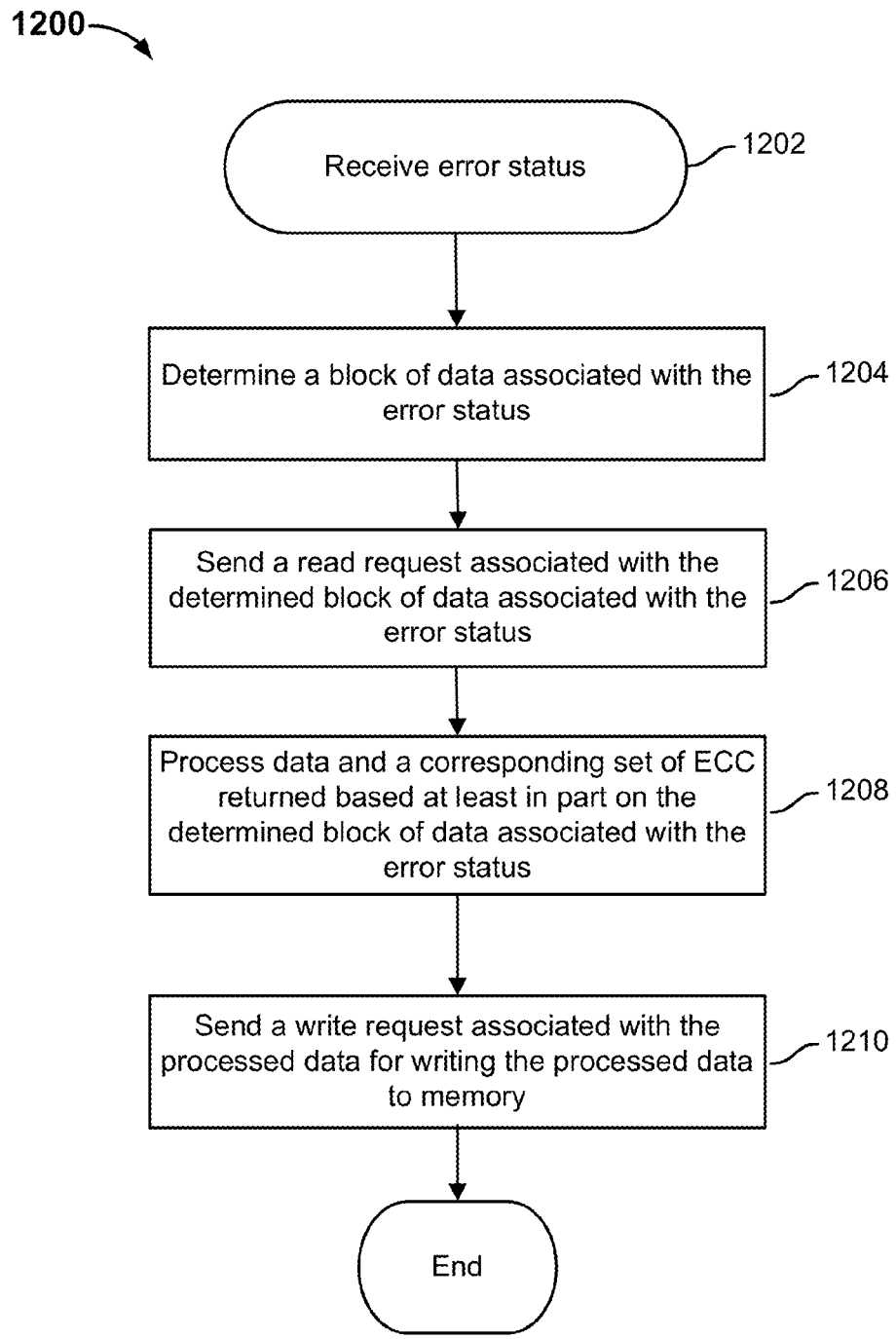
FIG. 12 is a flow diagram showing an example of a process for handling an error from the memory protection cache.

FIG. 12 is a flow diagram showing an example of a process for handling an error from the memory protection cache. In some embodiments, process 1200 is initiated at 612 of process 600. In some embodiments, process 1200 can be implemented at system 300. In some embodiments, process 1200 can be performed by master 302 of system 300.

At 1202, an error status is received. In some embodiments, the error status is received from the memory protection cache. In some embodiments, the error status is received from the memory protection cache in response to determining that data accessed at the memory via the Cache Access Region has uncorrectable error. For the example, the error status can include an address that is associated with the location of the data that led to the error.

At 1204, a block of data associated with the error is determined. In some embodiments, the error address of the error status is used to determine a block of data with which the error is associated. For example, the block of data can be the block of data that was accessed by the memory protection cache during a previous access to the memory (via a Cache Access Region) and this block of data was determined to have uncorrectable error. In some embodiments, a logical address (or a set of logical addresses) of the block of data associated with the error status is determined. In some embodiments, a physical address (or a set of physical addresses) is determined from the logical address (or set of logical addresses).

At 1206, a read request associated with the determined block of data associated with the error status is sent. In some embodiments, the read request is sent to the memory protection cache to access the data at the memory. In some embodiments, the read request includes the determined physical address (or set of physical addresses) of the block of data at memory. In some embodiments, the read request is sent via the Direct Access Region. In some embodiments, because the read request was sent via the Direct Access Region, the logical address (or set of logical addresses) is used as the physical address (or set of physical addresses) instead of remapping the logical address into a corresponding physical address.

At 1208, data and a corresponding set of ECC returned based at least in part on the determined block of data associated with error status are processed. In some embodiments, because the request was made via the Direct Access Region, the data at the determined block of data associated with the error status is returned as well as the set of ECC corresponding to that data (in contrast to a request made via the Cache Access Region where the corresponding set of ECC is not returned to the requestor). Furthermore, because the accessed data was requested via the Direct Access Region, the data is not cached or checked for error. For example, the returned data and ECC can be processed to determine the location of error and also the correct data.

At 1210, a write request associated with the processed data for writing the processed data to memory is sent. In some embodiments, the write request is sent to the memory protection cache via the Direct Access Region (e.g., to write the corrected data back to memory). In some embodiments, the write request includes a physical address (or a set of physical addresses) associated with the block at the memory to which the processed data is to be written.

Figure 13:
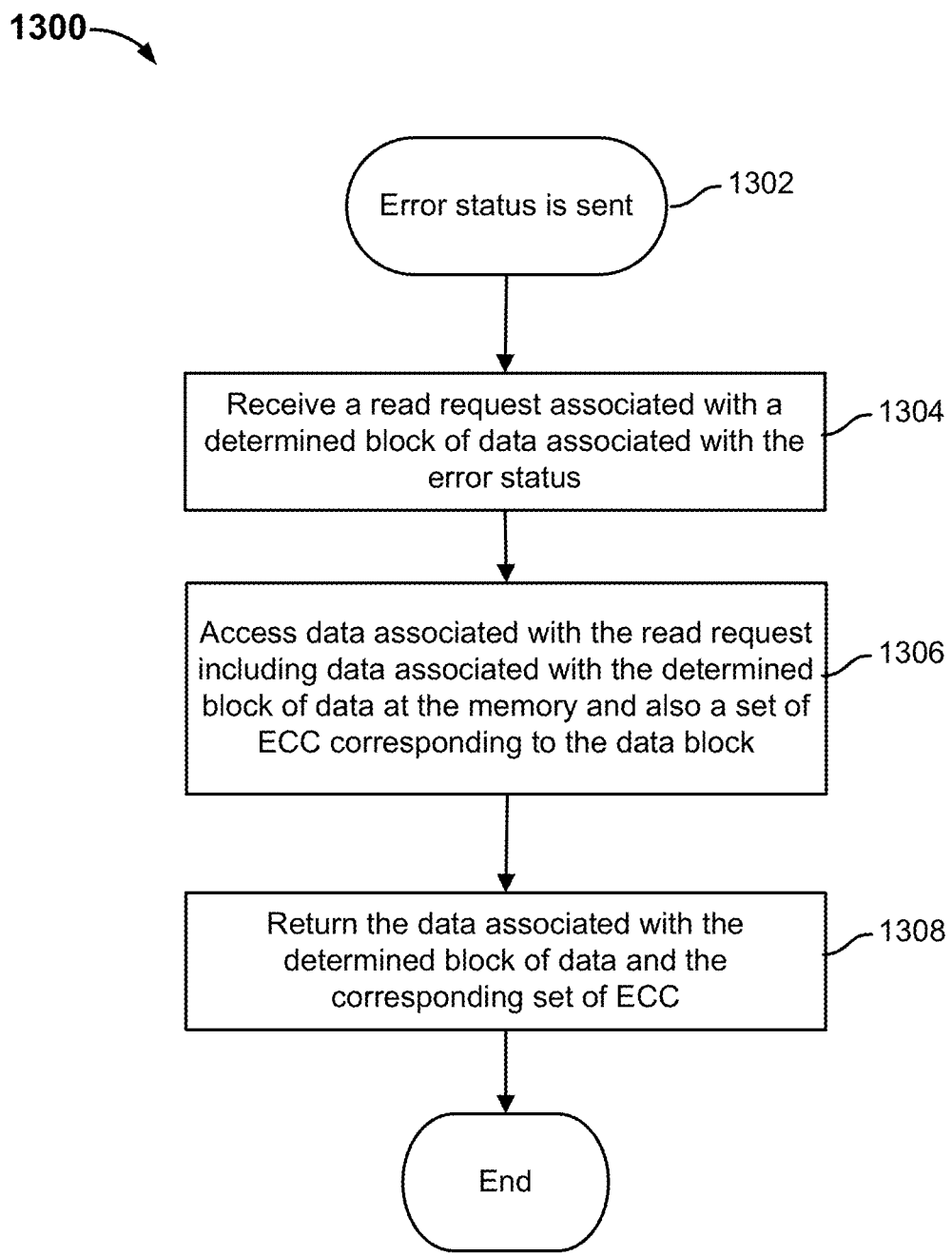
FIG. 13 is a flow diagram showing an embodiment of a process for handling an error.

FIG. 13 is a flow diagram showing an embodiment of a process for handling an error. In some embodiments, process 1300 is initiated at 612 of process 600. In some embodiments, process 1300 can be implemented at system 300. In some embodiments, process 1300 can be performed by memory protection cache 304 of system 300.

At 1302, an error status is sent. In some embodiments, the error status is sent to the master. In some embodiments, the error status is sent in response to determining that data accessed at the memory via the Cache Access Region has uncorrectable error. For the example, the error status can include an address that is associated with the location of the data that led to the error.

At 1304, a read request associated with a determined block of data associated with the error status is received. In some embodiments, the read request includes the determined physical address (or set of physical addresses) of the block of data at memory. In some embodiments, the read request is sent via the Direct Access Region. In some embodiments, because the read request was sent via the Direct Access Region, the logical address (or set of logical addresses) is used as the physical address (or set of physical addresses) instead of remapping the logical address into a corresponding physical address.

At 1306, data associated with the read request including data associated with the determined block of data at the memory and also a set of ECC corresponding to the block of data are accessed.

At 1308, the data associated with the determined block of data and the corresponding set of ECC are returned. In some embodiments, because the request was made via the Direct Access Region, the data at the determined block of data associated with the error status is returned as well as the set of ECC corresponding to that data (in contrast to a request made via the Cache Access Region where the corresponding set of ECC is not returned to the requestor).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for accessing data at a memory, comprising:
   a processor configured to:
   receive a request associated with an operation, wherein the request includes a logical address associated with the memory;
   determine a type of access associated with the request based at least in part on the logical address;
   generate a physical address based at least in part on (1) the type of access and (2) the logical address, wherein to generate the physical address based at least in part on (1) the type of access and (2) the logical address includes to:
   in the even that the type of access comprises a first type of access, generate the physical address based at least in part on translating the logical address; and
   in the event that the type of access comprises a second type of access, generate the physical address based at least in part on not translating the logical address;
   determine a block of data at the memory that includes data associated with the physical address; and
   access data at the block of data and a corresponding set of ECC from the memory based at least in part on the type of access; and
   the memory coupled to the processor and configured to provide the processor with instructions.

2. The system of claim 1, wherein to access data at the determined block of data and the corresponding set of ECC from the memory based at least in part on the type of access includes to:
   in the event that the type of access comprises the first type of access, determine whether the accessed data can be decoded based at least in part on the corresponding set of ECC; and
   in the event that the type of access comprises the second type of access, return the data associated with the determined block of data and the corresponding set of ECC.

3. The system of claim 2, wherein in the even that the type of access comprises the first type of access and in the event that the accessed data can be decoded, the processor is further configured to store the accessed data at a corresponding cache.

4. The system of claim 3, wherein in the event the operation comprises a write operation, the processor is further configured to:
   update the accessed data stored at the corresponding cache based at least in part on the request; and
   indicate that the update block of data stored at the corresponding cache is dirty.

5. The system of claim 4, wherein the processor is further configured to:
   generate a new set of ECC corresponding to the updated block of data; and
   write back data associated with the updated block of data and also the corresponding new set of ECC to the memory.

6. The system of claim 1, wherein a physical address of the corresponding set of ECC is sequential to a physical address associated with the block of data.

7. The system of claim 1, wherein a physical address of the corresponding set of ECC is not sequential to a physical address associated with the block of data.

8. The system of claim 1, wherein the block of data comprises a cache line.

9. The system of claim 1, wherein to determine the block of data includes to determine a start physical address and an end physical address associated with the block of data.

10. The system of claim 1, wherein to determine the block of data includes to determine a range of physical addresses associated with the block of data.

11. A method for accessing data at a memory, comprising:
  receiving a request associated with an operation, wherein the request includes a logical address associated with the memory;
  determining a type of access associated with the request based at least in part on the logical address;
  generating a physical address based at least in part on (1) the type of access and (2) the logical address, wherein generating the physical address based at least in part on (1) the type of access and (2) the logical address includes:
    in the event that the type of access comprises a first type of access, generating the physical address based at least in part on translating the logical address; and
    in the event that the type of access comprises a second type of access, generating the physical address based at least in part on not translating the logical address;
  determining a block of data at the memory that includes data associated with the physical address; and
  accessing data at the block of data and a corresponding set of ECC from the memory based at least in part on the type of access.

12. The method of claim 11, wherein accessing data at the determined block of data and the corresponding set of ECC from the memory based at least in part on the type of access includes:
  in the event that the type of access comprises the first type of access, determining whether the accessed data can be decoded based at least in part on the corresponding set of ECC; and
  in the event that the type of access comprises the second type of access, returning the data associated with the determined block of data and the corresponding set of ECC.

13. The method of claim 12, wherein in the event that the type of access comprises the first type of access and in the event that the accessed data can be decoded, further comprising storing the accessed data at a corresponding cache.

14. The method of claim 13, wherein in the event the operation comprises a write operation, further comprising:
  updating the accessed data stored at the corresponding cache based at least in part on the request; and
  indicating that the updated block of data stored at the corresponding cache is dirty.

15. The method of claim 14, further comprising:
  generating a new set of ECC corresponding to the updated block of data; and
  writing back data associated with the updated block of data and also the corresponding new set of ECC to the memory.

16. The method of claim 11, wherein the block of data comprises a cache line.

17. A computer program product for accessing data at a memory, the computer program product being embodied in a non transitory computer readable storage medium and comprising computer instructions for:
  receiving a request associated with an operation, wherein the request includes a logical address associated with the memory;
  determining a type of access associated with the request based at least in part on the logical address;
  generating a physical address based at least in part on (1) the type of access and (2) the logical address, wherein generating the physical address based at least in part on (1) the type of access and (2) the logical address includes:
    in the event that the type of access comprises a first type of access, generating the physical address based at least in part on translating the logical address; and
    in the event that the type of access comprises a second type of access, generating the physical address based at least in part on not translating the logical address;
  determining a block of data at the memory that includes data associated with the physical address; and
  accessing data at the block of data and a corresponding set of ECC from the memory based at least in part on the type of access.

* * * * *